United States Patent
Yin et al.

(10) Patent No.: US 6,259,273 B1
(45) Date of Patent: Jul. 10, 2001

(54) PROGRAMMABLE LOGIC DEVICE WITH MIXED MODE PROGRAMMABLE LOGIC ARRAY

(75) Inventors: Peter Yiyian Yin, Campbell; Ping Xiao, San Jose, both of CA (US)

(73) Assignee: ICT Acquisition Corp., San Jose, CA (US)

( * ) Notice: Subject to any disclaimer, the term of this patent is extended or adjusted under 35 U.S.C. 154(b) by 0 days.

(21) Appl. No.: 09/334,149

(22) Filed: Jun. 15, 1999

(51) Int. Cl.[7] ..................................................... H01L 25/00
(52) U.S. Cl. .................................. 326/41; 326/39; 326/40
(58) Field of Search .................................. 326/41, 39, 37, 326/40

(56) References Cited

U.S. PATENT DOCUMENTS

| | | | |
|---|---|---|---|
| 4,124,899 | 11/1978 | Birkner et al. | 364/716 |
| 4,758,746 * | 7/1988 | Birkner et al. | 307/465 |
| 4,789,951 | 12/1988 | Birkner et al. | 364/716 |
| 4,918,641 | 4/1990 | Jigour et al. | 364/716 |
| 5,046,035 | 9/1991 | Jigour et al. | 364/716 |
| 5,075,576 | 12/1991 | Cavlan | 307/465 |
| 5,714,890 | 2/1998 | Cline | 326/40 |
| 5,952,846 * | 9/1999 | Silver | 326/41 |
| 6,069,488 * | 5/2000 | Aaldering | 326/39 |

* cited by examiner

*Primary Examiner*—Huan Hoang
(74) *Attorney, Agent, or Firm*—Townsend and Townsend and Crew LLP; Henry K. Woodward

(57) ABSTRACT

An improved programmable logic device comprises a mixed mode programmable logic array in which a group of product terms generated by a programmable AND array are both fixedly connected to a group of OR gates and selectively connected to a programmable OR array. All the outputs of the OR gates and the programmable OR array are fed to a programmable multiplexer which provides a set of outputs of the device. The OR array is split into two sub OR arrays connected by a programmable OR array connection bit line to offer more flexibility. This structure mixes programmable OR array and fixed OR array together and provides the device with fast speed performance as well as high logic mapping flexibility and logic utilization.

10 Claims, 2 Drawing Sheets

PROGRAMMABLE LOGIC DEVICE WITH MIXED MODE PROGRAMMABLE LOGIC ARRAY

BACKGROUND OF THE INVENTION

This invention relates generally to programmable logic integrated circuits device and, in particular, to a programmable logic integrated circuits device with an improved logic built-in block.

A programmable logic device (PLD) that is now widely used in various applications generally comprises a programmable logic built-in block or logic array. This logic array is usually made up of a programmable AND array whose outputs drive a OR array. A plurality of input lines are provided to the AND array, and a plurality of output lines are fed by the OR array to drive a plurality of macrocells of the device. Basically there are two kinds of structures of this programmable logic built-in block or logic array. The first one, known as Programmable Array Logic (PAL) structure, features a programmable AND array fixedly connecting to a set of OR gates, with each OR gate being driven by a fixed number of product terms. The second one, known as Programmable Logic Array (PLA) structure, features a programmable AND array selectively connecting to a fully programmable OR array. Both of the structures have their own strengths and weaknesses when used to implement different kinds of logic design.

Most of the programmable logic devices apply the PAL structure as their basic programmable logic array structure because of its short propagation delay and small die size. However the fixed nature of the product terms of the PAL structure also presents some problems. The amount of the product terms a logic design requires varies with the applications. If the required logic exceeds the amount the fixed product terms can offer, direct fitting is impossible, and re-design and re-fitting are required. If the required logic is less than the amount the fixed product terms can offer, the unused product terms are wasted since the logic allocation is fixed. To solve these problems, some PLDs of this structure employ a foldback AND array to form a group of shared expander product terms which could be fed back into the array for use by any or all of the dedicated product terms to expand the logic on an output. The use of these shared expander product terms could implement extremely wide gating functions. However the basic problem with foldback AND array is that it implements an extended logic in multiple levels that require multiple passes through the array. This will greatly increase the delay of a logic design. Furthermore, a multiple level design is much more difficult to synthesize. Other PLDs using the PAL structure employ a dynamic product term steering or parallel expander scheme that offers the logic allocation function between logic array and macrocells. This can eliminate the multiple level logic problems introduced by the foldback AND array mentioned above, and also provides a wide range of gating functions on an output. But a further problem exists with this structure is if some product terms in one cluster are steered to extend its neighboring macrocell, the unused product terms of this cluster and its corresponding macrocell will be wasted. In addition, to obtain more flexible logic allocation ability, the steering structure becomes more and more complex.

Some programmable logic devices apply the PLA structure as their basic programmable logic array structure. This structure completely eliminates the logic allocation problems associated with foldback AND array and product term steering mechanisms by employing a fully programmable OR array selectively connectable to the programmable AND array. The fully programmable OR array offers the ability to effectively and accurately allocate logic as a design requires, with the ability to share full product terms. The device re-fitting ability is only limited by the maximum capability of the device. Traditionally, however, the devices with these two fully programmable arrays are slower than the device with a PAL structure since signals have to pass through two arrays, and the main delay of the device is contributed by two arrays.

In view of the foregoing, it would be desirable to provide an improve programmable logic device architecture with both flexible and effective logic allocation feature and high speed feature.

SUMMARY OF THE INVENTION

It is an object of this invention to provide a programmable logic device architecture that combines a flexible and effective logic allocation feature and a fast speed feature.

It is a further object of this invention to offer an improved programmable logic device architecture.

These and other objects are accomplished in accordance with the principles of the present invention by providing an improved programmable logic device with a mixed mode programmable logic array which combines flexible and effective logic allocation and fast speed in a single device.

In the present invention, the improved programmable logic device comprises a programmable AND array, a fully programmable OR array and a group of OR gates. The output product terms of the programmable AND array are fed fixedly to the group of OR gates and selectively to the fully programmable OR array. The former connection has the features of a PAL structure and the latter connection has the features of a PLA structure. Both the outputs of the OR gates and of the programmable OR array are fed to a programmable multiplexer which can select any one of the outputs to drive a macrocell according to the specific design. The output product terms from the programmable AND array can be selectively allocated through the fixed OR gates block to achieve speed performance, or through the programmable OR array to achieve allocation flexibility and effectiveness. Different parts of logic of a design can be effectively allocated into different OR blocks according to its characteristic and logic capacity requirements. In addition, the product terms are shared between the fixed OR gates block and the programmable OR array, which further increases the effectiveness of the logic allocation. To alleviate the delay caused by the OR array, the fully programmable OR array of this invention is divided into two sub arrays being connected by an OR array connection facility which could be programmed to connect or disconnect any individual couple of sum terms in the two sub OR arrays. This structure further enhances the OR array logic allocation flexibility while maintaining a relatively small delay.

A feature of the invention is an improved programmable logic device architecture.

Another feature of the invention is a programmable logic device architecture with a fixed OR gates block and a fully programmable OR array, which offer a combination of flexible and effective logic allocation ability and a fast speed performance.

Yet another feature of the invention is a split OR array which alleviates the device delay caused by the OR array.

These and other objectives and features of the invention will become more apparent by the following accompanying drawings and the detailed description of the preferred embodiments.

DESCRIPTION OF THE SPECIFIC EMBODIMENTS

In a preferred embodiment, the present programmable logic device is a CMOS electrically erasable programmable logic device, which can be programmed by a logic designer to perform various kinds of logic functions. In accordance with the principles of the invention, the device includes a fully programmable OR array and a fixed OR array driven by same group of product terms from a programmable AND array. As explained in more detail below, this structure mixes a programmable OR array and a fixed OR array together and provides the device with high logic allocating flexibility and effectiveness as well as fast speed performance.

Figure 1:
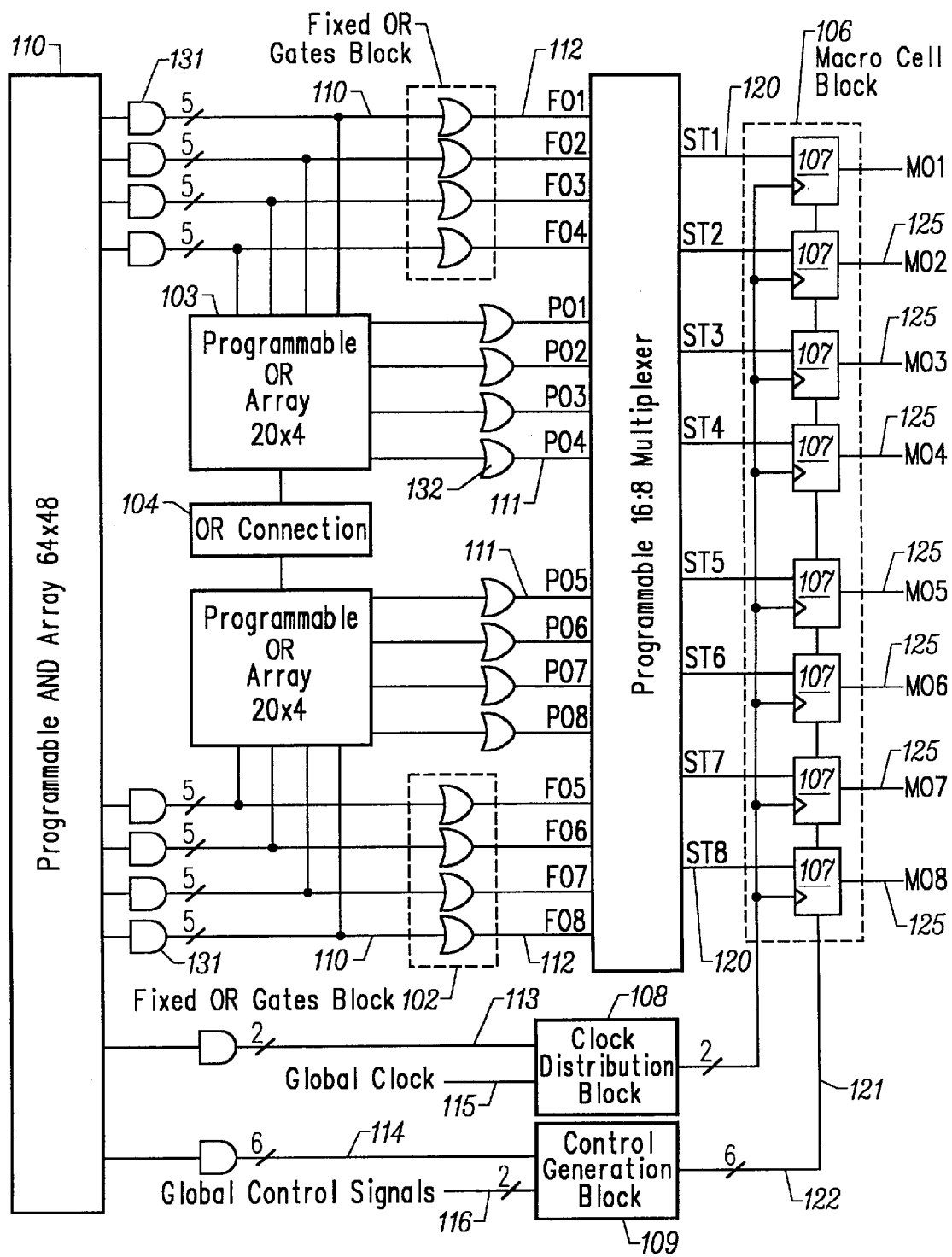
FIG. 1 is a block diagram of an illustrative embodiment of the programmable logic device of the present invention.

FIG. 1 shows a block diagram of an illustrative embodiment of the programmable logic device of the present invention. The device comprises a programmable AND array 101, a fixed OR gates block 102, a fully programmable OR array 103, and a programmable multiplexer 105 that selects a group of outputs 120 from the fixed OR gates 102 or from the programmable OR array 103 to drive the macrocells 107 of the device. The AND symbol 131 in the figure represents an AND operation on a product term, and the OR symbol 132 represents an OR operation on a sum term. The programmable AND array 101 receives a group of device inputs signals and generates a group of product terms 110. This group of product terms is fed to a first fixed OR array 102 called fixed OR gate block. At the same time, it is also fed to a second fully programmable OR array 103. A fixed limited OR gate has the feature of limited delay, while a fully programmable OR array has the feature of high logic allocating flexibility and effectiveness. So the mixture of these two kind of arrays offers these features in a single device. If a design or a part of a design requires fast delay, the fixed OR gates can be selected to allocate the logic. If a design or a part of a design requires more product terms than the fixed OR gates can offer, or has many shareable product terms, the fully programmable OR array can be selected to allocate the logic flexibly and effectively. The outputs 112 of the fixed OR gates 102 and the sum terms 111 of the fully programmable OR array 103 are fed to programmable multiplexer 105 which generates a group of output signals 120 to drive the macrocells 107 of the device. The programmable multiplexer 105 could be easily implemented by a group of 2:1 multiplexers, and each output signal 120 is selected from a fixed OR gate output 112 or a programmable OR array sum term 111. Under this structure, any one of the macrocells 107 could receive a logic signal either from the corresponding OR gate in the fixed OR gates block 102 or from the corresponding sum term of the fully programmable OR array 103, according to the specific design requirement. This structure mixes the feature of the fast timing delay with the high logic allocating flexibility and effectiveness in a single device and offers an improved performance compared with the prior art programmable logic devices.

The fully programmable OR array 103 of this embodiment of the invention is divided into two sub OR arrays connected by a OR connection facility 104 which can be individually programmed to connect or disconnect any couple of sum terms in the two sub OR arrays. The fully programmable OR array is a main contributor to the device propagation delay. The larger a programmable OR array is, the larger the capacitive load on a sum term is, hence, the slower the device propagation delay is. The divided sub OR arrays can help to improve the device speed performance. On the other hand, by programming the OR connection facility 104, the logic capacity on the corresponding sum term can be doubled to meet the high logic capacity application requirement. So by offering this structure, the speed performance and the logic capacity of the fully programmable OR array can be flexibly controlled according to the specific design requirement.

The programmable logic device also comprises a clock distribution block 108 and a control signal generation block 109 to control the operation of the macrocells 107. Two product terms 113 from the programmable AND array 101 are sent to the clock distribution block 108 as the local clock resources. Global clock 115 is also sent to the clock distribution block 108 for the global clocking purpose. So, through the clock distribution block 108, the macrocells can be flexibly configured in synchronous or asynchronous clocking applications. Similarly, six product terms 114 from the programmable AND array 101 and the global control signals 116 are sent to the control generation block 109. The control generation block 109 generates a group of control signals for the macrocells 107. These control signals include the asynchronous set and reset signals as well as the output enable signals. Through the control generation block 109, different ranges of the control signals could be obtained according to the design requirement.

Specifically, as an embodiment of the programmable logic device of the invention shown in FIG. 1, there are 64 input signals (not shown in FIG. 1) to the programmable AND array 101 which outputs a total of 48 product terms 110, 113 and 114. The size of the programmable AND array 101 is 64×48. Among them, 40 terms 110 are input to the fixed OR gates block 102 and to the fully programmable OR array 103. These 40 product terms are divided into 8 groups, each of which fixedly connects to an OR gate in the fixed OR gates block 102. The OR gates generate 8 output signals FO1 to FO8 112. The detailed structure of the fixed OR gates block will be described below. The fully programmable OR array 103 are divided into two sub OR arrays, each of which receives 20 product terms and generates 4 sum terms PO1 to PO4 and PO5 to PO8 111. The size of each sub OR array is 20×4. By programming all the bits of the OR connection facility 104 to OFF states, the OR array 103 could provide a total of 8 sum logic terms of a maximum of 20 product terms. Program all the bits to ON states, the OR array 103 could provide a total of 4 sum logic terms of a maximum of 40 product terms. The outputs FO1 to FO8 and PO1 to PO8 are fed to a programmable 16:8 multiplexer 105, which generates 8 logic output signals ST1 to ST8 to drive the 8 macrocells 107.

Figure 2:
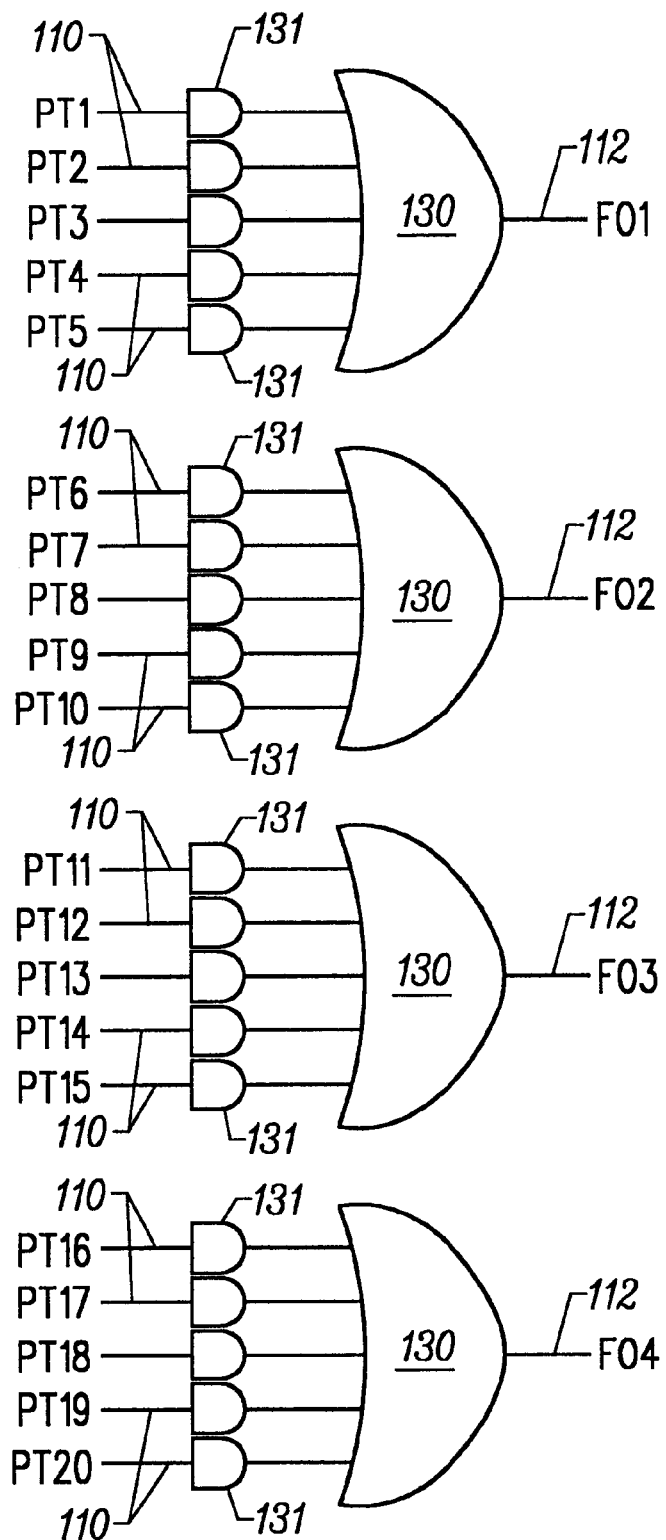
FIG. 2 is a schematic diagram of the fixed OR gates block in accordance with the invention.

FIG. 2 shows a schematic diagram of an embodiment of the fixed OR gates block (102 in FIG. 1) of the invention. Only half of the fixed OR gates are shown. As described above, 20 product terms PT1 to PT20 110 are fed to this block. The AND symbol 131 indicates the logic AND operation on the product terms. The 20 product terms 110 are divided into 4 groups of 5 product terms. Each group of product terms fixedly connects a 5 inputs OR gate 130, and every OR gate 130 output a fixed OR logic 112. Combined with the input product terms 110, the OR gate 130 could implement most of the logic with very short delay.

The invention as described is a specific embodiment and illustrates the principles of the invention. It is not to be construed as limiting the invention. Modifications and applications can be made by skilled designers without departing from the true spirit and scope of the invention as defined by the appended claims.

What is claimed is:

1. A programmable logic device comprising:
   a programmable AND array having a plurality of input lines and a plurality of product terms;
   a group of fixed OR gates fixedly connected to said plurality of product terms of said programmable logic AND array and providing a group of fixed OR output signals;
   a fully programmable OR array receiving said plurality of product terms of said Programmable logic AND array and generating a group of sum terms; and
   a programmable multiplexer selecting output signals from said group of fixed OR output signals of said group of fixed OR gates and from said group terms of said fully programmable OR array, whereby output product terms from the programmable AND array can be selectively allocated through the fixed OR gates to achieve speed performance, and through the programmable OR array to achieve allocation flexibility and effectiveness.

2. The programmable logic device of claim 1 and further comprising a clock distribution block to generate clock signals for said group of macrocells.

3. The programmable logic device of claim 1 and further comprising a control generation block to generate control signals for said group of macrocells.

4. The programmable logic device of claim 1 and further comprising a group of macrocells driven by said group of output signals of said programmable multiplexer.

5. The programmable logic device of claim 4 wherein said group of macrocells comprises D-type flip-flops with asynchronous set and reset.

6. A programmable logic device comprising:
   a programmable AND array having plurality of input lines and a plurality of product terms;
   a group of OR gates fixedly connected to said plurality of product terms of said programmable logic AND array and providing a group of fixed OR output signals;
   a fully programmable OR array being divided into two sub OR arrays, each of which receiving said plurality of product terms of said Programmable logic AND array, and generating a group of sum terms; and
   a programmable multiplexer selecting a group of output signals from said group of fixed OR output signals of said group of OR gates and said group of sum terms of said fully programmable OR array, whereby output product terms from the programmable AND array can be selectively allocated through the fixed OR gates to achieve speed performance, and through the programmable OR array to achieve allocation flexibility and effectiveness.

7. The programmable logic device of claim 6 and further comprising a clock distribution block to generate clock signals for said group of macrocells.

8. The programmable logic device of claim 6 and further comprising a control generation block to generate control signals for said group of macrocells.

9. The programmable logic device of claim 6 and further comprising a group of macrocells driven by said group of output signals of said programmable multiplexer.

10. The programmable logic device of claim 9 wherein said group of macrocells comprises D-type flip-flops with asynchronous set and reset.

* * * * *